United States Patent [19]

Brotz

[11] Patent Number: 4,900,368

[45] Date of Patent: * Feb. 13, 1990

[54] FOAMED ENERGY CELL

[76] Inventor: Gregory R. Brotz, P.O. Box 1322, Sheboygan, Wis. 53081

[ * ] Notice: The portion of the term of this patent subsequent to Dec. 9, 2003 has been disclaimed.

[21] Appl. No.: 182,131

[22] Filed: Apr. 15, 1988

Related U.S. Application Data

[60] Continuation-in-part of Ser. No. 891,582, Aug. 1, 1986, Pat. No. 4,746,458, which is a division of Ser. No. 588,344, Mar. 12, 1984, Pat. No. 4,628,143.

[51] Int. Cl.[4] .............................................. H01L 31/04

[52] U.S. Cl. .................................... 136/253; 148/33.2; 310/303; 428/305.5; 428/408; 252/501.1; 252/505; 252/517; 252/502

[58] Field of Search ......................... 136/253; 310/303; 148/33.2; 252/501.1, 502, 505, 517, 301.4 R, 301.16; 428/305.5, 408

[56] References Cited

U.S. PATENT DOCUMENTS

| | | | |
|---|---|---|---|
| 3,956,195 | 5/1976 | Topchiashvili et al. | 252/511 |
| 4,628,143 | 12/1986 | Brotz | 136/253 |
| 4,746,458 | 5/1988 | Brotz | 252/301.16 |

*Primary Examiner*—Aaron Weisstuch

*Attorney, Agent, or Firm*—William Nitkin

[57] ABSTRACT

A photovoltaic material having an open-cellular foamed nature incorporated into an electric current generating cell activated by a material circulated through the open cells of the foam.

7 Claims, 4 Drawing Sheets

FOAMED ENERGY CELL

This application is a continuation-in-part of my previous application entitled Photovoltaic Material, Ser. No. 891,582 filed Aug. 1, 1986 now U.S. Pat. No. 4,746,458 which application is a divisional application of my previously filed application entitled Foamed Nuclear Cell, Ser. No. 588,344 filed 03/12/84, now U.S. Pat. No. 4,628,143.

BACKGROUND OF THE INVENTION

1. Field of the Invention

This invention is in the field of electric current generating cells and materials for the manufacture thereof and more particularly relates to cells which are made of foamed material and have radiating material circulating therein to ionize a material in the cell to activate photovoltaic portions of the cell to produce electric currents.

2. History of the Prior Art

U.S. Pat. No. 3,497,392 to J. B. Walker shows an electric current generating cell including radioactive material which "cell has a sealed case in which there is a photoelectric core that is sensitive to ultraviolet radiations. This core is provided with a multiplicity of cavities communicating with the outside of it and preferably interconnecting with one another, whereby to provide the core with a very large surface area in relation to its size. The case also contains an ionizable fluid that surrounds the photoelectric core and fills its cavities. This fluid is such that it produces ultraviolet radiation when ionized...The fluid is ionized by the radiations of. . . radioactive material. . . The resulting ultraviolet radiations activate the core to produce electric current. . . " To create the "multiplicity of cavities", Walker used a plurality of coated balls packed together with the spaces therebetween as the cavities. Unfortunately, the majority of the space which was taken up by the solid mass of the balls was useless in this cell. U.S. Pat. No. 3,956,195 to Topchiashvili et al discloses a foamed semiconductor composition which is in the form of a generally closed-cellular foam through which no interactive materials could effectively circulate.

Applicant's inventions in this field include U.S. Pat. No. 4,628,143 for a Foamed Nuclear Cell which utilizes an open-cellular foam excited to produce electricity by material entered into the interstices of the foamed structure. Applicant also has utilized foamed cellular material in U.S. Pat. Nos. 4,626,612; 4,676,966; and 4,681,981 relating to foamed thermocouple structures.

SUMMARY OF THE INVENTION

The Walker patent shows an appreciation that an increase of surface area within such a sealed cell will increase the efficiency of batteries and it is an object of this invention to provide a new type of energy cell with a substantial internal surface area. To accomplish this increase in surface area, the cell of this invention has an open-cellular foamed core. Such foam, with its myriad of small interstices provides a very large surface area in relation to the total volume of the cell for a substantially increased area of photovoltaic reaction and the resulting increased efficiency in the production of electric current.

It is a further object of this invention to provide a foam of carbon, metal or other suitable material coated with a semiconductor or other type photovoltaic junction material. In one embodiment the resulting semiconducting foam structure may be impregnated with a solid radioactive material and phosphor blend. When an appropriate pole is inserted in the foam, a second nonconnected pole would create an electric current with the first when the resulting structure is within a vacuum. Such cells though may include many other basic constructions. For example, an embodiment with the semiconducting foam coated with phosphor may be utilized with a radioactive electrically-conducting gas which can be entered into the cell. In another embodiment the semiconducting foam may be coated and/or impregnated with a radioactive source material and phosphor blend using a conductive gas or a vacuum as mentioned above to produce a conductive path to the second electrode. In yet another embodiment the semiconducting foam can be coated with a radioactive source material and a conductive fluorescing gas can be entered into the cell.

In yet another embodiment a radioactive source can be centrally placed within an open area in a carbon foam matrix with no semiconductor layer or luminescing agent being present. When this foam structure is placed in a vacuum chamber with conductive chamber walls making a first terminal with the carbon foam insulated from the chamber wall being a second terminal, electron or alpha emissions from the radioactive source would be collected on the high surface area of the carbon foam and when a circuit was made between the terminals, an electric potential would be produced.

A still yet further embodiment can utilize metal foam structures rather than the carbon foams as cited above. Basically, to prepare a metallic foam, a cavity mold is filled with carbon or ceramic foamed beads and a grid is placed over the top of the cavity to retain the beads in position while molten metal is poured in and settles in the interstices formed between the foamed beads and is then solidified usually by cooling. The foamed beads are then oxidized out of the metal structure. The beads could also be removed by strong solvents or caustic or acid solutions if the beads were, for example, made of ceramics and thus leaving an open-cellular metallic foam. This metallic foam is then doped and the surface is coated with a semiconductor or other type photovoltaic junction material as described in the procedures to coat the carbon foams within this application. A preferred embodiment would be a cast aluminum open-cellular foam material with a selenium photovoltaic coating on the interior thereof. Selenium is easy to vaporize and condenses in the proper crystallographic state to produce a photojunction. The foam also can be reticulated, which helps avoid non-internally coated areas. In one embodiment the metallic foamed substrate can be placed in a magnetic field which may impede certain directions of current flow and help to form a di-polar structure to dielectrically solidify the substrate which can be cast at cyrogenic temperatures to help produce an amorphous P or N-type substance. In yet a further embodiment the foam material could be of a molten silicon which is poured into a mold cavity containing foamed ceramic beads which would produce an open-cellular cast polycrystalline silicon structure which can be doped and imbedded with particles propelled by an accelerator or by ionizing a reactive gas within the open-cellular areas. The internal cellular surfaces of this structure could then be coated by one of a number of possible processes such as electro-plating, electroless deposition, vapor deposition, ion deposition of metal or of other material. The initial structure can also have the molten silicon of which the foam is made mixed with a radio-active material which in some embodiments can include a luminescent material. Also, such radioactive material can be pulverized and mixed with a liquid and entered into the glass foam via such suspension slurry and circulated with the aid of ultrasonic vibrations therein. The surfaces of the internal glass structure can also be contacted via conductive liquids, vacuum, ionized gases or even liquids which are solidified to form solid conductors which are cast into the open cells of the foam.

Many types of cells can be made from the foams of this invention. One such cell which can be charged by sunlight can have the cellular material of this invention within a containment vessel with means to circulate a fluid through the cell with the fluid also being circulated to an area outside of the cell where it is struck by sunlight and activated. The activated fluid is then returned to the cell to interact therewith to produce current as will be described below.

It is still yet a further object of this invention to illustrate a method of fabrication of a foamed substrates and specific types of cells.

FIG. **3*a*** illustrates an alternate embodiment of a boron diffusion chamber.

Figure 4:
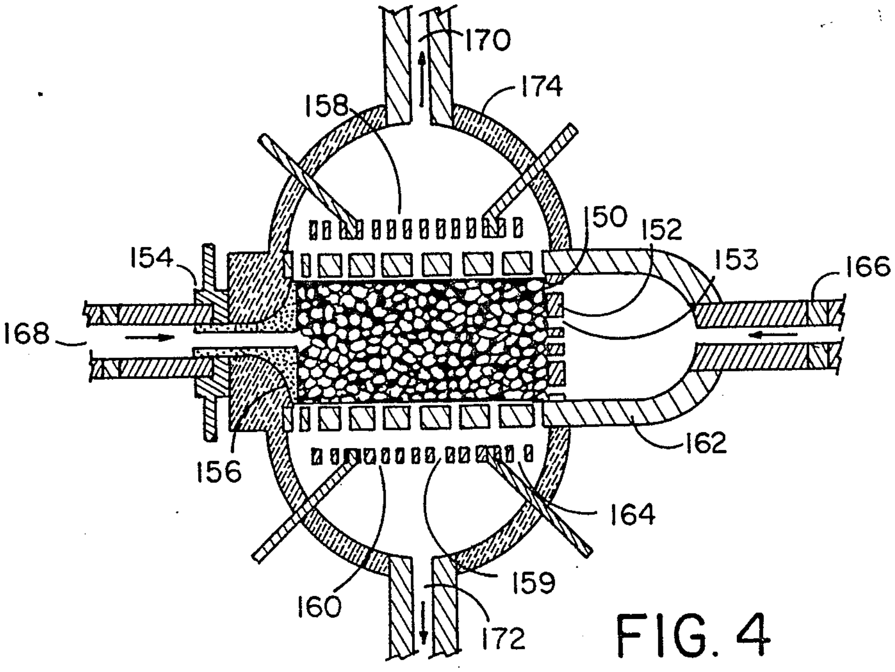

FIG. 4 illustrates an apparatus for fusing silicon particulate to a carbon foamed substrate.

Figure 5:
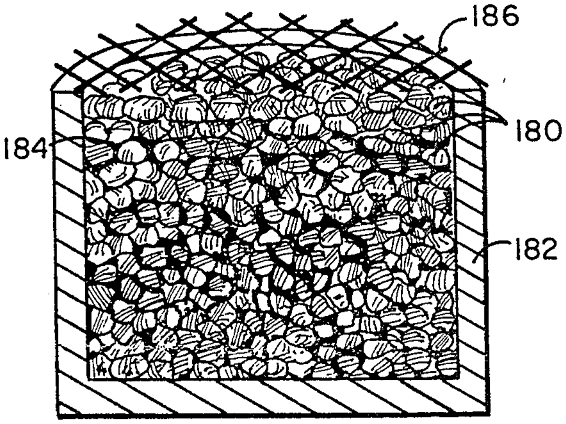

FIG. 5 illustrates metal foam production.

Figure 6:
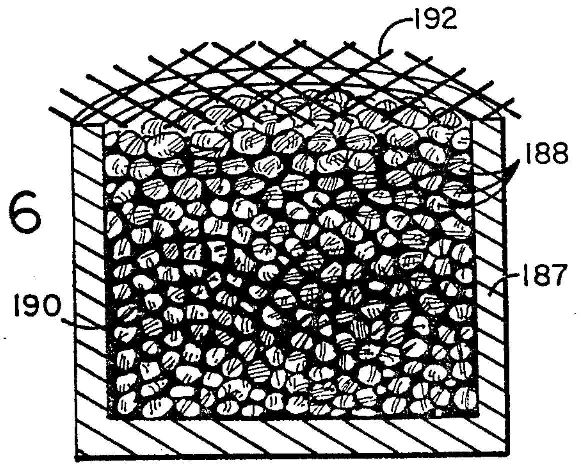

FIG. 6 illustrates silicon foam production.

Figure 7:
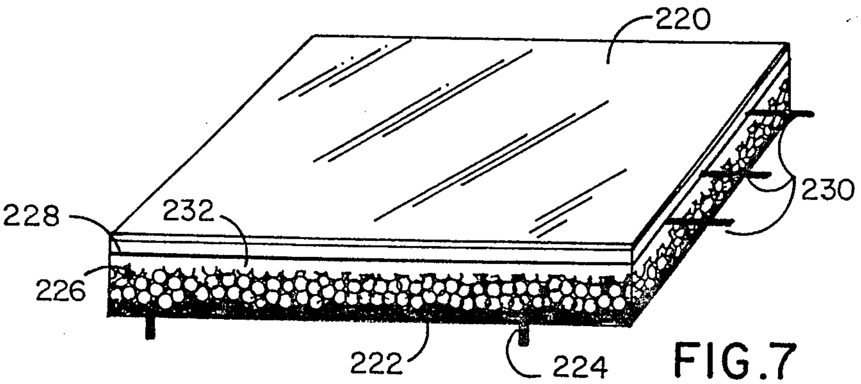

FIG. 7 illustrates a cell activated by a solar panel.

Figure 8:
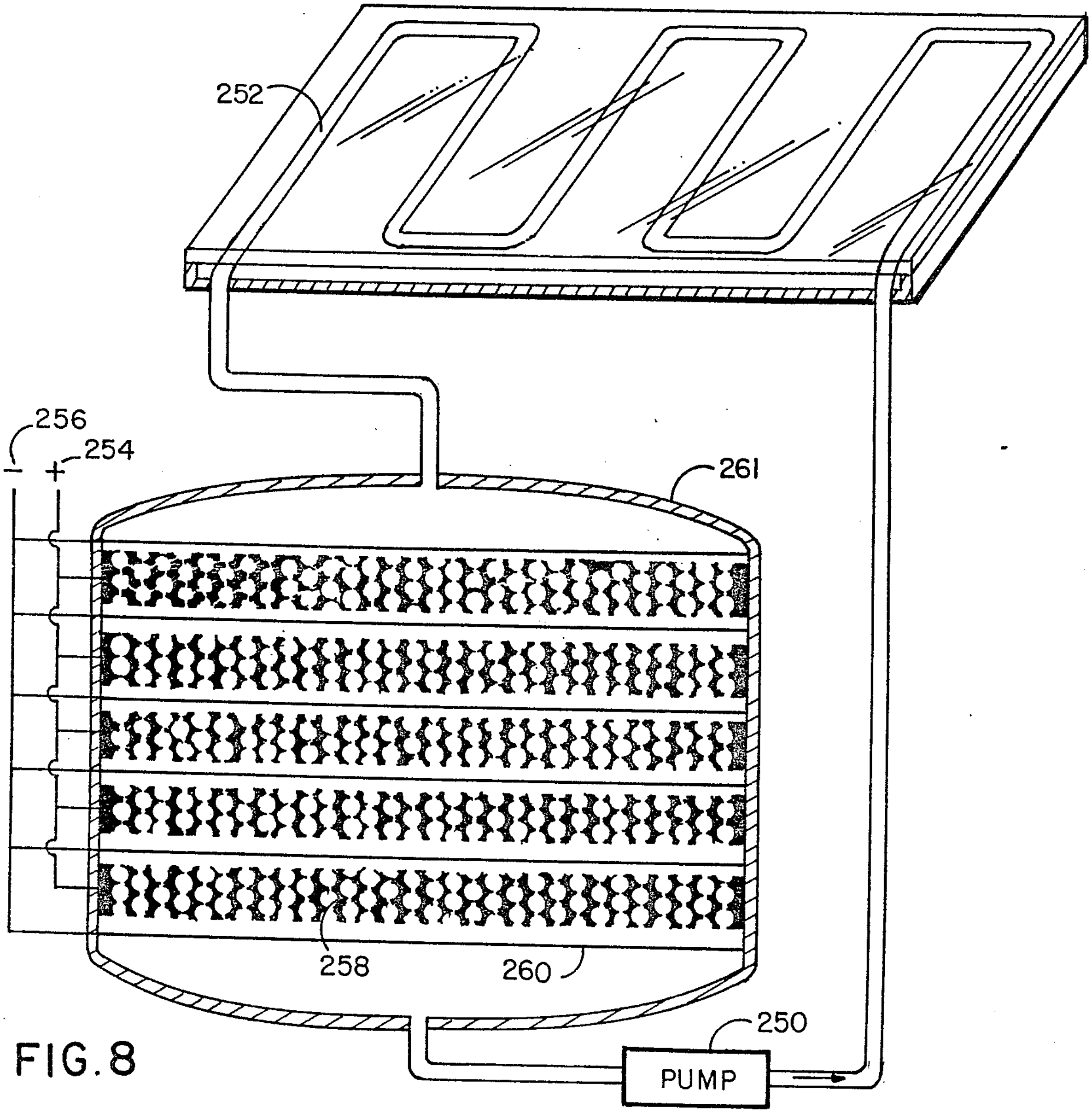

FIG. 8 illustrates an alternate embodiment of a cell activated by a solar panel.

DESCRIPTION OF THE PREFERRED EMBODIMENT(S)

Figure 1:
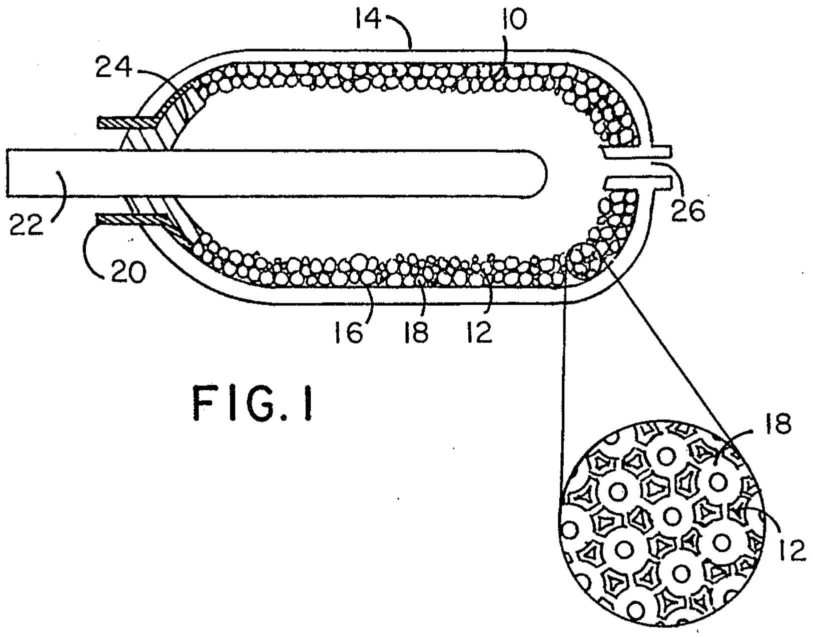
FIG. 1 illustrates a cross-sectional view of a nuclear cell of this invention.

FIG. 1 illustrates a cross-sectional view of a typical nuclear cell of this invention. In this embodiment a carbon foam 10 is shown upon which a semiconductive layer 12 such as silicon or equivalent has been coated. Using carbon as the foam substrate has many advantages over other materials as it will not just melt and is a good conductor. The carbon foam 10 is held within a combination pressure-housing and radiation shield 14. The core of pressure-housing 14 is filled with carbon foam 10 and around the edges of the carbon foam against the pressure-housing is seen a joining of foam cells forming a surface continuity 16 of solid carbon. Spaces 18 within the foam illustrate the interstices through which the gas can travel. An electrode 20 protrudes from the cell, being interconnected with the surface continuity 16 of the carbon foam, which electrode 20 forms the first pole of the cell. A second electrode 22 forming a di-pole with the first pole extends into the chamber and is surrounded by the semiconductive carbon foam 10. Electrode 22 extends out of the pressure-housing to form a second pole of the energy cell. Insulation 24 is provided between electrode 20, which may form a concentric circle around the second electrode 22, and such second electrode 22 to prevent arcing. The carbon foam in this cell having a semiconductive layer thereon can be activated to produce electric current between the electrodes when an electrically conductive radioactive gas is entered into the cell. Such radioactive gas may be entered into the cell through port 26 from a gas storage means such as a tank or piston or equivalent which are well known in the art. Once the gas has been forced into the cell, the reaction discussed above begins and electrical current will start to be produced.

Since the invention herein concerns foams, it should be noted that in the prior art phenolic and metallic foams are well known and the easiest way to make a carbon foam is by carbonizing a free-rise phenolic foam. Free-rise foams are produced by catalyzing a liquid single-stage resin with an acid. The resin has a blowing agent and as the system heats up due to the reaction between the resin and the acid, the blowing agent vaporizes to form cells while the resin hardens. The heat of the mold cavity decomposes the blowing agent to produce gas which in turn forms cells. The volume of injected mass increases to fill the cavity while the mold supplies heat to cure the now-formed resin. These methods produce foams with un-uniform cell size and irregular distances between the cells themselves. Moreover, because of the lack of any high pressures during the blowing of the foam, the density of the walls of the cells is low and also the ratio of open cells to closed cells is low. Since open cells are necessary for this invention, free rise foams are not the most desirable to utilize. Further, any residual acid catalyst affects the final structure as it breaks down the polymer properties at high temperatures. While the final product may be pure carbon as the phenolic heats up during the first stages of the carbonization process, such acid has a detrimental effect.

Figure 2:
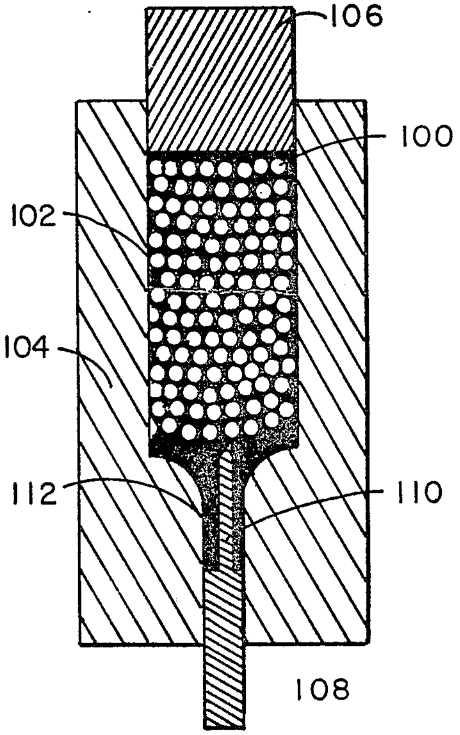
FIG. 2 illustrates a device for producing the open-cellular foam of this invention.

The following procedures can be followed for the fabrication of the foamed energy cell of this invention. It is important that, because of the needs of coating the foam with a crystalline semiconductor layer, the foam have a strong integrity, high intercellular wall density, and impact resistance. One process shown in FIG. 2 for producing such a foam is to provide a thermal plastic with close to a zero carbon residue such as a polymethylmethacrylate in the form of beads 100 which is mixed with a predetermined amount of thermosetting resins 102 which may be a phenol or equivalent so that when this mixture is pressurized in mold 104 shown sideways, the powdered resin melts and fuses with itself. A thermal plastic used for the beads can be crystalline and should have as little cold flow as possible at the molding temperature of the thermosetting resin. Plunger 106 creates pressure in mold 104 and after the process is completed, a core pin 108 which was inserted into the resin from below acts as an ejector for the foam from the mold and when removed, forms a channel 110 therein. In the molding process, because the beads have a specific density less than that of the thermosetting resin, they float to the top, leaving a non-porous resin structure 112 around core pin 108 at the bottom of mold 104. If a higher density bead is utilized, such as lead shot, it would sink to the bottom, forming a porous structure at that point. Near the end of the carbonizing stage of the core, oxygen may be passed therethrough, which helps to insure the complete openness of the cell structure. An amount of resin is selected so that thermal plastic beads 100 touch in as close-packed a density as the shape of the spheres will allow. The melting point of the thermo-plastic beads should be higher than the mold temperature of the thermo-setting die used to mold the mixture of the thermo-plastic beads and thermo-setting resin. The beads may be of any shape such as spherical, oval, cubic, or pyramidal. The thermo-setting resin can be a phenolic which will produce a glassy carbon or a polyimide to produce a graphite foam or any mixture of these two or any other equivalent high-carbon residue resin. After the mixture has been molded, the molding can be post baked. The molding is then placed in a carbonizing furnace and during the cycle, the low carbon residue thermo-plastic beads 100 vaporize out of the molding, leaving open cells because of bead contact with exactly determined cell size and a high intercellular wall density.

Another method of producing a good quality foam is to use a regular thermoplastic foam and impregnate it with a furfural resin dissolved in a furfural alcohol, squeeze out the excess and carbonize the resultant matrix.

Metallic foams can also be utilized. One process for the production of metallic foams is to fill a mold cavity with carbon or ceramic foamed beads, place a grate over the opening with hole sizes less than that of the beads so that they cannot escape, and pour a molten metal into the cavity. After the metal has cooled, the beads are removed such as by oxidizing them out to form an open-cellular structure. If the oxidation rate of the carbon beads is faster than that of the metal, the foam structure can be preserved with an acid.

Other methods of removing the beads could be used such as with a solvent for the beads or a caustic or acid solution. Greensand beads could be utilized where they could be removed by vibrating to break the structure of the beads and by washing them out of the structure. Other materials could be utilized to form the foams, such as a molten silicon poured into a cavity containing a foamed ceramic bead, wherein the resulting structure when the ceramic bead is removed is by the processes as mentioned above would yield a cast polycrystalline silicon open-cellular foam which can be treated by coating as by a number of different types of processes.

Figure 3:
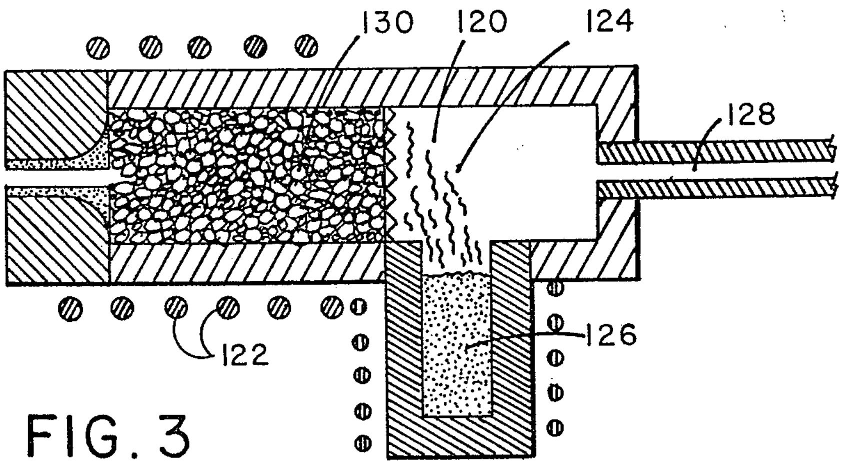
FIG. 3 illustrates a boron diffusion chamber.
Figure 3A:
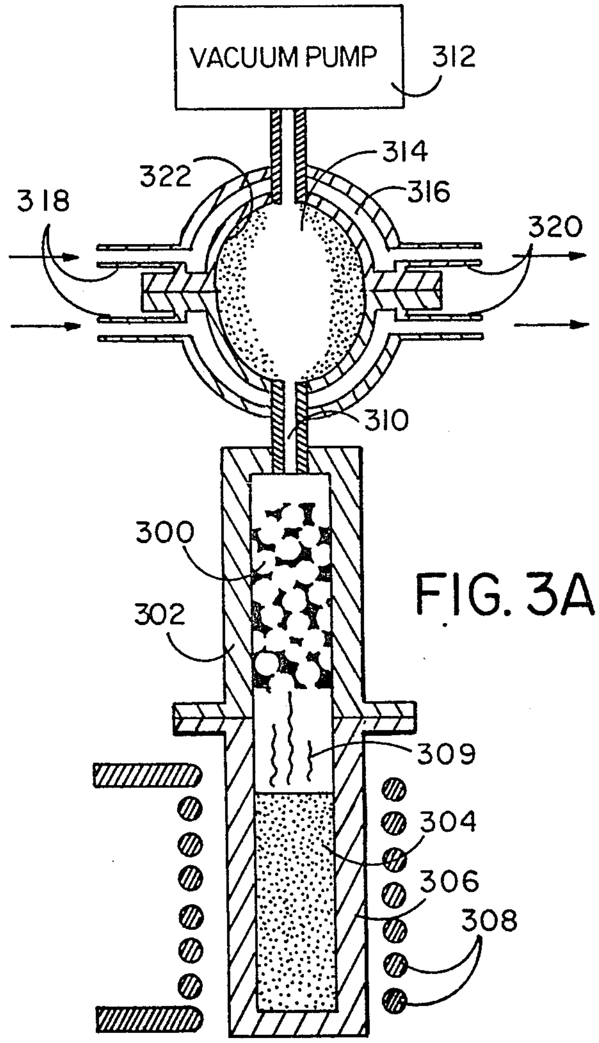

When working with metal foams, they could be doped and then coated with a semiconductor or other type photovoltaic junction material. One method of doing this is to lay down a continuous film of boron internally throughout this open-cellular foam molding structure. One way this procedure can be accomplished is by placing the carbon or other equivalent foam structure in the diffusion chamber depicted in FIG. 3. The chamber is heated, such as by coils 122 therearound and vaporized boron 124 emanating from an adjoining second heated chamber 126 with nitrogen emanating from supply tube 128 is entered into chamber 120. The nitrogen acts as a carrier gas and is passed through the open-cellular carbon foam structure 130 carrying the vaporized boron. Chamber 120 containing open-cellular carbon foam structure 130 is then cooled and the vaporous boron 124 condenses on the carbon foam's cell walls to form a continuous film. FIG. *3a* illustrates an alternate embodiment of a boron diffusion chamber wherein boron 304 is heated in open-topped chamber 306 by electric coils 308. Boron vapors pass upwards through chamber 302 containing open-cellular foam 300. Boron vapors 309 are drawn through open-cellular foam 300 by vacuum pump 312 interconnected by tube 310 at the top of chamber 302. Boron vapors 309 are condensed around the inside surface 322 of condensing chamber 314 through which they enter, drawn by vacuum pump 312. Condensing chamber 314 is cooled by jacket 316 through which cooling fluid is pumped through inlets 318 and then around condensing chamber 314 to outlets 320. The boron film serves two purposes: first it will, during the semiconductor layering step described below, diffuse into the foam substrate and into the silicon layer to be formed, which diffusion will dope the silicon to produce a semiconductor photocell. The other purpose of the boron film when using a carbon substrate is that its presence at the carbon/silicon junction will prevent the formation of silicon carbide which is an insulator and detrimental for the purposes of producing a photovoltaic device.

The next step is to produce a polycrystalline layer on top of the boron coated foam. A slurry of micro-divided ultra-pure silicon is formed with a low-boiling liquid. The foam with its boron layer is then immersed into the slurry. Either pressure or vacuum may be applied to the slurry chamber to insure good penetration of the slurry into the foam. When penetrated by the slurry, the foam is removed therefrom and placed into a heated vacuum chamber to remove the liquid part of the slurry. As the liquid is removed, the silicon particulate concentrates and dries on the cell walls. The next step is to melt and fuse the silicon particulate to produce a continuous polycrystalline semiconductive layer. In some cases it may be possible to produce an amorphous monocrystalline layer. This process must be accomplished as quickly as possible to avoid production of silicon carbide if the substrate is carbon or at least to hold the production of silicon carbide to an absolute minimum. One method of accomplishing this fusion is to use the carbon foam substrate as a pole for the di-electric heating thereof. When the potential of the proper voltage and frequency is applied, then the carbon substrate, being a pole, will heat causing the silicon particles to melt and fuse. The cooling of the layer is critical as it determines the morphology of the polycrystalline layer. When the silicon particles have fused and form a continuous molten film layer throughout the open cellular structure, at the moment the di-electric current is turned off, a cold gas formed from liquid nitrogen can be passed through the foam to freeze the innate crystal structure. This may be followed immediately by the introduction of a hot gas to prevent the damage of the carbon foam that would result from thermal shock due to the sudden lowering of temperature but such hot gas should not be hot enough to remelt the silicon film layer.

An apparatus for fusing the silicon particulate to a carbon foamed substrate to form a semiconductive layer is shown in FIG. 4. Seen in this view is the foamed boron-treated foam 150 that has silicon particulate coating all of its internal surfaces. At the end thereof is a ceramic diffusion plate 152 with holes 153 therein to allow gas flow therethrough. An elecrode 154 is connected to the substrate by means of the carbon structure 156 originally formed as resin around the core pin which has been removed therefrom. The second electrode has its elements 158 and 160 disposed above and below the carbon foam having diffusion holes 159 formed therein for gas passage therethrough. Carbon foam 150 is contained within a ceramic subvessel 162 which has therein a plurality of combination gas-flow control and diffusion holes 164. First inlet tube 168 allows gas to enter the carbon foam from the side having the first electrode through carbon structure 156. Second inlet tube 166 allows gas to enter from the opposite side of the crabon foam through holes 153 in ceramic diffusion plate 152. The gas, after passing through the first and second inlet tubes, goes through the carbon foam and exits through the first and second outlet ports 170 and 172 at the top and bottom of the ceramic electrode housing 174 which contains the ceramic subvessel 162 and the second electrodes. Valves can be provided on the inlets and ports to control the flow of gas and the internal pressure in the ceramic electrode housing 174. While one gas can be entered from the first inlet, a second kind of gas can be provided from the opposite second inlet. When current is applied through the first and second electrodes, the resulting heat in the carbon foam melts the silicon particulate and immediately upon cessation of the current, cold gas formed from liquid nitrogen or equivalent cold gas is passed through one of the inlets through the carbon foam and causes the silicon to uniformly crystallize. A second hot gas as discussed above can be then entered for example through the second inlet.

Another method of forming the semiconductor layer is by the decomposition of a silane by ionizing noble gas in the structure as described above. In some cells it may be desirable to prevent damage to the semiconductor layer due to radiation. One way to accomplish this is in a suitable chamber, a set of ceramic rolls, heated internally by a gas and oxygen, is used to melt and shear together a mixture of glass, phosphor, and a radioactive source, all with close melting points. The chamber can also be pressurized to supress the boiling points of any of the components. An example of three components which would meet the requirements are silicon dioxide, an isotope of calcium, and zinc sulfide as long as the radiation intensity and half-life are in the useful range. The resulting rolled admixture is ground to a size where a slurry of a low boiling liquid and this admixture can penetrate the foam semiconductor. Because the radioactive source and phosphor are held internally in a glass matrix, only light escapes and the possible damaging emissions from the radioactive source do not reach the semiconductor layer.

FIG. 5 illustrates the production of a molten metal foam wherein carbon or ceramic foamed beads 180 are placed within a cavity 182 shown in cross-section and molten metal 184 is poured thereover, with the beads held in place by a grid 186 similar to that described above. The beads can be removed by well known means such as oxidation, solvents, or caustic or acids solutions and the resulting metal foam can be doped and then, as described above, coated with a semiconductor material or other type photovoltaic junction material put on in a similar fashion. One desired embodiment would be if the cast metal foam is of aluminum with a selenium photovoltaic coating. The exterior surface can be reticulated, which may cause a better coating of the process.

FIG. 6 illustrates a cavity 187 in cross-section containing foamed ceramic beads 188 held in place by grid 192 wherein a molten silicon 190 is poured to create, when the beads are removed by the process as discussed above, a cast polycrystalline silicon open-cellular foam which is doped and embedded with particles. It may be difficult to perform some of the processes as recited above on a glass foam structure, but such structure can be embedded with particles by accelerators or by ionizing a reactive gas therein. The internal surfaces of this structure can be coated by electroplating, electroless deposition, vapor deposition, ion deposition of metal or other materials, and the material utilized in forming the molten silicon may be radioactive and even could have mixed therewith a luminescent material to cause the cell to be self-reacting. Within this cell, the materials for luminescing could be pulverized and washed therethrough or mixed into the glass foam via suspension or slurry and moved around therein with an ultrasonic vibration. Also, contact could be made to the surfaces inside of the glass polycrystalline structure by a conductive liquid, vacuum, ionized gas, or even solidified liquids forming solid conductors if they are cast into the internal cells of foam structure. In the case where the polycrystalline foam is a P-type material, the circulated material can be N-type and vice versa.

FIG. 7 illustrates a cell of this invention wherein the activating material is charged by sunlight, which has a solar panel 220 associated therewith wherein the luminescing material 232 that transforms infrared to visible wavelengths could be a suspension of zinc sulfide in a conductive fluid such as salt water or equivalent solution. This luminescing conductive liquid gains energy when channeled through transparent collection plates of the solar panel 230 when exposed to the sun and such liquid 232 would be circulated by a pump at a rate so that its residence time in the foam cell 226 is equal to the fluid's deactivation time. A first pole 224 extends from the foam substrate 222. A second pole electrode 228 extending to pole 230 can be located next to the foam cell 226 in a configuration to maximize its surface area. Such second electrode 228 can be a foamed conductor also and can be of such a size and shape that the internal surface area is the same as the first pole. In the embodiment shown each foamed pole can form opposing sheets of foam.

In the embodiment of FIG. 7 a pump is not necessary to circulate the fluid as the flat nature of the cell allows a luminescing particle near panel 220, after being activated by sunlight, to start the particles below it not struck by sunlight to luminesce which in turn starts the particles below it to luminesce and so on until all the particles in the foam cell are luminescing. Such a cell can be placed near the focal point of a solar parabolic dish reflector to receive a greater intensity of sunlight.

FIG. 8 illustrates a plurality of such photovoltaic or semiconductive foam cells with activated fluid pumped therethrough by pump 250 from solar panel 252 where such fluid is activated by exposure to sunlight. The first pole 254 is connected to the foam substrate 258 while the second pole 256 is connected to grids 260. It is known that certain chemicals can transform infrared wavelength energy into visible wavelength energy and other chemicals can do the opposite, which chemicals can be used in the cells of this invention.

One usage of such a cell is to utilize the remaining half-life from waste or spent fuel from fission reactors which can be used to activate such foamed cells and thus can be a source of a safe network for production of electrical energy. Such foam cells can be placed inside radioactive waste storage canisters with little modification to the canisters as they exist today and useful electrical currents can be produced and extracted from poles which are extended outside the canisters while storing the waste material at the same time. If it is ever decided that the radioactive source is to be extracted from the foam, the foam can be crushed and, in the case of carbon substrates, oxygen or air can be burned with the material or the carbon can be oxidized to produce carbon dioxide. The radioactive source will be a residual in the form of a solid (slag) or a condensable liquid or fume, depending on the physical properties of the isotope used. In the case of metal substrates, isotopes can be recovered by the process of melt decanting.

The foamed cells of this invention are superior to the prior art flat photovoltaic cells in that the impedance is less as the distance an electron has to travel from the point where it enters a hole is less in terms of collecting surface area per distance or length of substrate to pole. The volume resistivity however would depend on the type of material being used. When carbon is used as a foam substrate, its resistance will diminish as its temperature increases from the heat of the circulating fluids.

As discussed above one can magnetize the foam substrate so that all the magnetic domains are directionally the same. Random magnetic domains can put atomic valence orbitals in configurations that impede current flow and thus become electronically saturated. One process to form a dipolar structure is to dielectrically solidify the substrate. It can also be dielectrically cast to cryogenic temperatures to produce an amorphous P or N-type substance.

In a further embodiment of a solar cell, an open-cellular foam is activated by an ionized luminescing or otherwise radiating gas or vapors of a solid that would be ionized by concentrating sunlight on a point and circulating such ionized fluid through the foam making electrical contact with the ion plasma and the internal surfaces of the foam where photovoltaic, thermionic or thermocouple type currents can be produced. Solar concentrators of either the parabolic or trough type can be used.

The foamed cell of this invention as stated before has a great surface area. For example, a cylinder of such foam having a 1 inch diameter and a height of 2 inches with a cell diameter of 1/64 inch has been calculated to have approximately 8 sq. ft. of internal surface area.

Although the present invention has been described with reference to particular embodiments, it will be apparent to those skilled in the art that variations and modifications can be substituted therefor without departing from the principles and spirit of the invention.

I claim:

1. A photovoltaic material comprising:

an open-cellular foam material having an internal surface area; and a photoelectric material layer on said foam's internal surface area.

2. The material of claim 1 wherein said foam is comprised of carbon.

3. The material of claim 1 wherein said foam is glass.

4. The material of claim 3 wherein said foam includes within its composition a radioactive material and a luminescent material.

5. An electric current generating cell comprising:

a container;

an open-cellular foamed material held within said container;

a coating on the interior of the cells of said foam of a semiconductor or other type photoelectric junction material;

a first pole electrode interconnected to said coating, said pole extending out of said container;

a fluid or gaseous activating material entered into said open cells in said foam adapted to interact therewith for the production of an electric current; and a second pole electrode in said container in contact with said activating material, said pole extending out of said container.

6. The cell of claim 5 further including:

a luminescing material in said activating material;

an area in which said activating material is circulated and exposed to a light source to activate same; and means for said activated luminescing material to be in proximity with said internal open cells of said foam.

7. The cell of claim 6 wherein said second pole electrode comprises a grid of open-cellular foamed material in proximity to said coated open-cellular foamed material in said container.

* * * * *